United States Patent [19]

Miyagaki et al.

[11] Patent Number: 5,093,564
[45] Date of Patent: Mar. 3, 1992

[54] PHOTOSENSOR HAVING AN AMORPHOUS SILICON PHOTOABSORPTION LAYER

[75] Inventors: Shinji Miyagaki, Tokyo; Seigen Ri, Kanagawa, both of Japan

[73] Assignee: Fujitsu Limited, Kawasaki, Japan

[21] Appl. No.: 610,590

[22] Filed: Nov. 8, 1990

[30] Foreign Application Priority Data

Nov. 8, 1989 [JP] Japan .................. 1-288624

[51] Int. Cl.$^5$ ............................................ H01J 40/14
[52] U.S. Cl. ...................... 250/208.1; 357/30
[58] Field of Search .................. 250/208.1, 211 J; 358/213.18, 213.16, 213.24, 213.31; 357/30 H, 30 E, 30 D, 30 K

[56] References Cited

U.S. PATENT DOCUMENTS 4,403,239 9/1983 Yamazaki .
4,740,824 4/1988 Yano et al. .................. 250/208.1
4,982,079 1/1991 Yagyu .................. 250/208.1

FOREIGN PATENT DOCUMENTS 1113959 7/1984 European Pat. Off. .

OTHER PUBLICATIONS

T. Takeshita et al., "Completely Integrated a-Si/a-SiC Heterojunction Contact-Type Linear Image Sensor with Poly-Si TFT Drivers", Society for Information Display International Symposium, Digest of Technical Papers, pp. 255-258, Baltimore, Maryland, May 16-18, 1989.

Patent Abstracts of Japan, vol. 12, No. 287, (E-643) [3134], Aug. 5, 1988 & JP-A-63-6463, Mar. 22, 1988.

Primary Examiner—David C. Nelms
Assistant Examiner—K. Shami
Attorney, Agent, or Firm—Staas & Halsey

[57] ABSTRACT

A photosensor comprises an insulator layer, a first electrode on the insulator layer for collecting first type carriers formed upon incidence of optical radiation, the first electrode being segmented into a plurality of pixel electrodes separated from each other by a gap, a first silicon carbide layer provided on the insulator layer to cover the plurality of pixel electrodes including the gap separating adjacent pixel electrodes, an optical absorption layer of amorphous silicon provided on the silicon carbide layer continuously such that the amorphous silicon layer extends over the plurality of pixel electrodes and the gap between adjacent pixel electrodes, the optical absorption layer producing the first type carriers and second type carriers having opposing polarity to the first type carriers upon incidence of the optical radiation, a second silicon carbide layer provided on the amorphous silicon layer for protecting the optical absorption layer from chemical reaction, and a second electrode of a transparent material provided on the silicon carbide layer for collecting the second type carriers produced in the optical absorption layer, wherein the first silicon carbide layer is doped to have a conductivity that enables formation of an electric field equal to or larger than about 4 volts/um in magnitude in the amorphous silicon layer and such that the conductivity is equal to or smaller than the conductivity of the amorphous silicon layer.

8 Claims, 7 Drawing Sheets

FIG. 1

PRIOR ART

FIG. 2

PRIOR ART

PHOTOSENSOR HAVING AN AMORPHOUS SILICON PHOTOABSORPTION LAYER

BACKGROUND OF THE INVENTION

The present invention generally relates to photoelectric conversion devices and more particularly to a photosensor having an amorphous silicon photoabsorption layer for photoelectric conversion.

Photosensors are used in various technical fields such as image sensors. The photosensors using amorphous silicon provides a particularly preferable feature of improved sensitivity due to the high efficiency of photoelectric conversion that is pertinent to the amorphous silicon band structure. However, the photosensor of this type has a problem of forming afterimages or decay lag, and there is a demand to suppress such a decay lag as much as possible. Further, to achieve high resolution images including a large number of picture elements, photosensors have to be assembled on a common substrate as an integrated circuit with high integration density. In such an integrated circuit of photosensors, it is necessary to eliminate the leak current between adjacent pixels.

Figure 1:
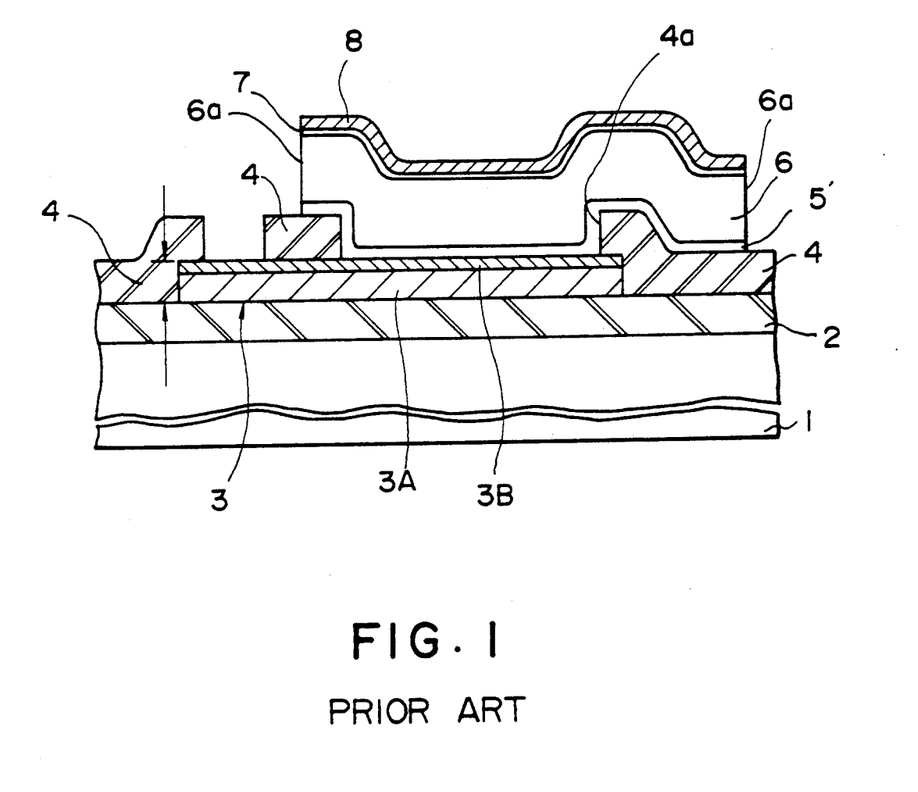
FIG. 1 is a diagram showing the cross-section of a typical conventional photosensor.

FIG. 1 shows a typical conventional photosensor employing amorphous silicon for the photoabsorption layer.

Referring to FIG. 1, the photosensor comprises a silicon substrate 1 covered by a silicon oxide insulator layer 2. On the insulator layer 2, there is provided an insulator layer 4 of phosphosilicate glass (PSG) except for an opening 4a that exposes a part of the insulator layer 2. On the exposed part of the insulator layer 2, there is provided a lower electrode structure 3 that includes a layer of aluminum alloy and a titanium nitride (TiN) layer 3B serving for the diffusion barrier.

Further, an undoped, intrinsic type silicon carbide layer 5 of amorphous phase is provided on the electrode structure 3. On the electrode structure 3, there is provided an amorphous silicon photoabsorption layer 6 as an essential element for the photoelectric conversion. Further, an amorphous silicon carbide layer 7 doped to the p+-type is provided on the amorphous silicon layer 6, and an upper, transparent electrode layer 8 of so-called ITO (indium tin oxide) is provided further on the silicon carbide layer as an electrode opposing the pixel electrode 3A. Thereby, a photodiode is formed between the electrode 3 and the electrode 8. In the illustrated example, the amorphous silicon layer 6 is deformed by a side wall 6a together with the silicon carbide layers 5 and 7 such that the amorphous silicon layer 6 is separated from other amorphous silicon layer forming adjacent photodiodes. In response to the patterning of the layers 5-7, the ITO layer 8 is also patterned.

Figure 2:
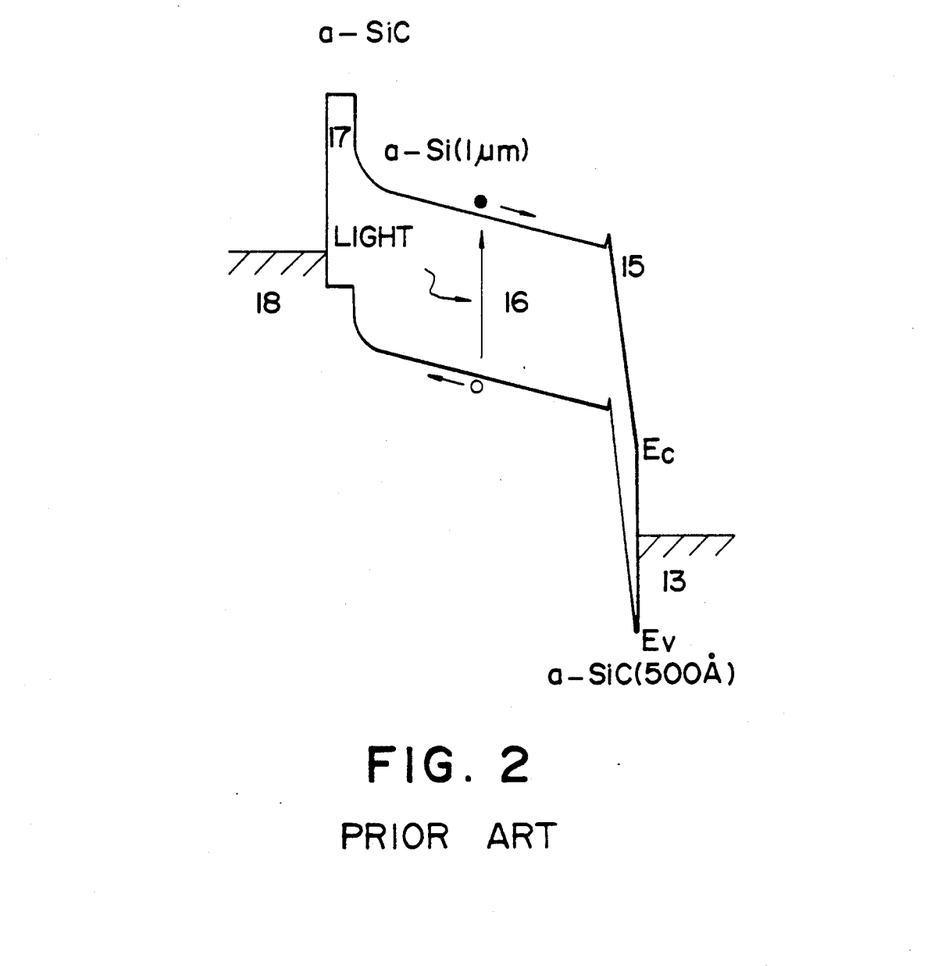
FIG. 2 is a diagram showing the band structure formed in the photosensor of FIG. 1.

FIG. 2 shows the band structure of the photosensor of FIG. 1.

In use of the device of FIG. 1, an acceleration voltage is applied across the upper electrode 8 and the lower electrode 3 and thereby there is formed a gradient of potential or electric field in the amorphous silicon layer 6 as shown by the sloped conduction band $E_C$ and the valence band $E_V$. Upon incidence of an optical beam, there are formed electron-hole pairs in the silicon layer 16 due to the inelastic scattering of photons, and the electrons thus formed are collected by the lower electrode 3 after moving through the silicon layer 6 and crossing through the silicon carbide layer 5 along the sloped conduction band. On the other hand, the holes are collected by the ITO electrode after passing through the amorphous silicon layer 6 and the silicon carbide layer 7 along the sloped valence band. Thereby, the photodiode causes a photoelectric current to flow, and the intensity of the current thus obtained is generally proportional to the intensity of the light beam, i.e., the number of photons in the light beam. Thus, the detection of incidence of the light beam is achieved.

In the structure of FIG. 1, the injection of unwanted electrons into the amorphous silicon layer from the ITO electrode 8 is effectively prevented by the potential barrier formed in the amorphous silicon carbide layer 7. Thus, the silicon carbide layer 7 contributes to decrease the dark current of the photodiode. On the other hand, the lower amorphous silicon carbide 5 contributes to prevent the reaction between the amorphous silicon in the layer 6 and the aluminum electrode 3 at the time of fabrication of the device.

In this conventional photosensor, there is a problem in that, because of the high resistivity of the undoped silicon carbide layer 5, a large electric field develops in the silicon carbide layer 5 as can be seen in the steep slope of the band diagram of FIG. 2. Such a large electric field in the silicon carbide layer 5 inevitably reduces the electric field in the amorphous silicon layer 6 and thereby the acceleration of the electrons and holes in the amorphous silicon layer tends to be made insufficiently. Such an insufficient electric field increases the decay lag when the photodiode is used as an image sensor for reading images. It is known that an electric field of at least 4 volts/$\mu$m is needed in order to satisfactorily suppress the decay lag (Kuriyama H., et al. "Suppression of the Decay Lag of a-Si Photodiodes," Abstract of 1989th annual meeting, The Institute of Television Engineers of Japan, pp. 7-8, July 19-21, 1989, Osaka).

The foregoing problem of poor decay lag may be eliminated when doped silicon carbide is used for the silicon carbide layer 5 such that the silicon carbide layer 5 becomes conductive. However, such a doping of the silicon carbide, rendering the silicon carbide layer 5 conductive, inevitably invites leakage of electric current between adjacent pixels. In order to prevent such leakage current to flow, it is necessary to divide the photosensor into a number of isolated pixels by patterning the amorphous silicon layer 6 as shown in FIG. 1 together with the silicon carbide layers 5 and 7 and the ITO electrode 8 thereon. However, such a process of patterning, including the etching process of silicon, silicon carbide and oxide, increases the number of steps necessary for fabricating the photosensor and hence its cost.

SUMMARY OF THE INVENTION

Accordingly, it is a general object of the present invention to provide a novel and useful photosensor wherein the problems aforementioned are eliminated.

Another and more specific object of the present invention is to provide a photosensor wherein a sufficient electric field is guaranteed in an amorphous silicon photoabsorption layer used for producing electron-hole pairs. According to the present invention, the holes and electrons produced in the amorphous silicon layer is immediately removed therefrom because of the increased electric field, and the undesirable effect of decay lag is minimized.

Another object of the present invention is to provide a photosensor comprising a number of pixels formed on a common substrate, wherein the device has a structure easy to fabricate and wherein the leak of current between adjacent pixels is minimized.

Another object of the present invention is to provide a photosensor, comprising: an insulator layer, a first electrode provided on the insulator layer, said first electrode being segmented into a plurality of pixel electrodes separated from each other on the insulator layer by a gap, a first silicon carbide layer provided on the first electrode to cover the plurality of pixel electrodes including the gap separating adjacent pixel electrodes, an amorphous silicon layer provided on the silicon carbide layer in correspondence to the plurality of pixel electrodes including the gap between adjacent pixel electrodes, a second silicon carbide layer provided on the amorphous silicon layer, and a transparent second electrode provided on the second silicon carbide layer, wherein the first silicon carbide layer is doped to have a conductivity that enables formation of an electric field equal to or larger than about 4 volts/$\mu$m in magnitude in the amorphous silicon layer and such that the conductivity of the first silicon carbide is equal to or smaller than the conductivity of the amorphous silicon layer. According to the present invention, the electrons and holes, formed in the amorphous silicon layer in response to incidence of an optical beam, are immediately removed therefrom because of the increased electric field in the amorphous silicon layer and the formation of decay lag is significantly reduced. On the other hand, as the conductivity of the doped first silicon carbide layer is set equal to or smaller than that of the amorphous silicon layer, the leak of current across the adjacent pixel electrodes via the first silicon carbide layer is substantially eliminated without patterning the first silicon carbide layer.

Other objects and further features of the present invention will become apparent from the following detailed description when read in conjunction with the attached drawings.

DETAILED DESCRIPTION

Hereinafter, a first embodiment of the present invention will be described with reference to FIGS. 3-6.

Figure 3:
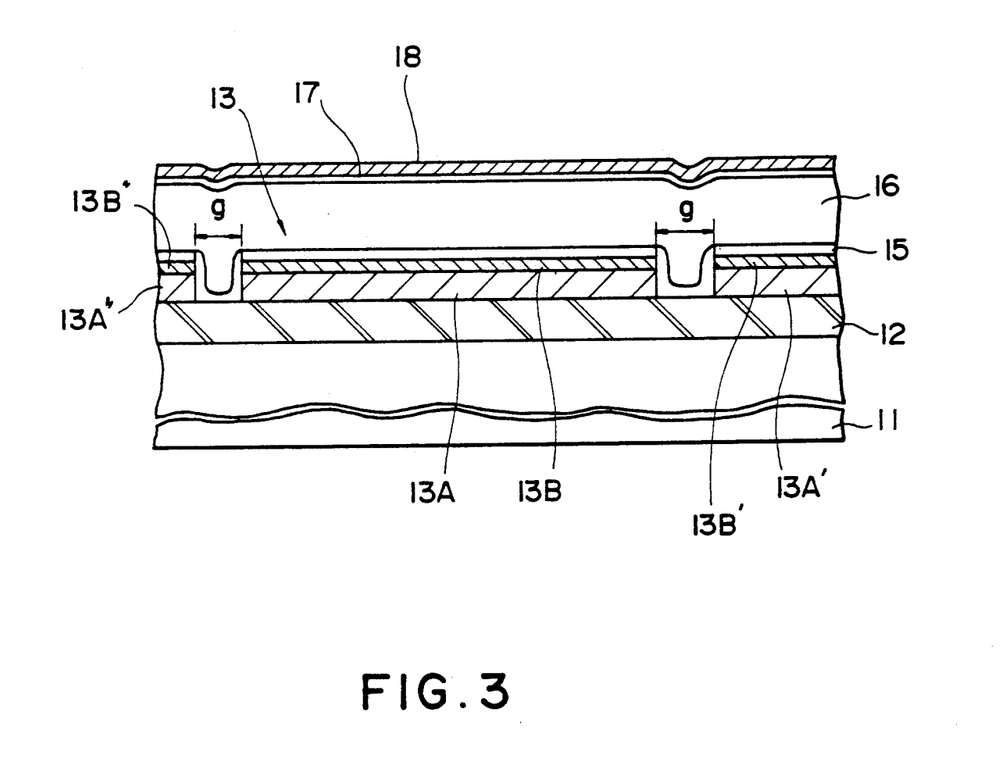
FIG. 3 is a cross-sectional view showing a first embodiment of the photosensor according to the present invention.

Referring to FIG. 3 showing a cross-sectional view, the photosensor of the present embodiment comprises a silicon substrate 11 covered by a silicon oxide insulator layer 12. On the insulator layer 12, there is provided a lower electrode structure 13 corresponding to the lower electrode structure of FIG. 1. Thus, the lower electrode structure 13 includes a layer of aluminum alloy divided into a number of segments or pixel electrodes 13A, 13A', 13A" ..., with a gap g formed between adjacent pixel electrodes. On the pixel electrode 13A, there is provided a titanium nitride (TiN) layer 13B that serves as a diffusion barrier. Similarly, TiN diffusion barriers 13B' and 13B" are formed on the pixel electrodes 13A' and 13A", respectively.

Further, a silicon carbide layer 15 of amorphous phase is provided to cover the entire electrode structure 13 including the gap g, and an amorphous silicon photoabsorption layer 16 is provided on the silicon carbide layer 15 as an essential element for the photoelectric conversion. The amorphous silicon forming the photoabsorption layer 16 is doped lightly to the p-type with the impurity concentration level of about $10^{16}$ cm$^{-3}$. Thereby, the amorphous silicon has a conductivity of about $10^{-9} - 10^{-11}$ $\Omega^{-1}$ cm$^{-1}$. The photoabsorption layer 16 produces electrons and holes upon incidence of optical beam as is well known.

It should be noted that the silicon carbide layer 15 covers the side walls of the pixel electrodes in correspondence to the gap g, including the part of the upper surface of the insulator layer 12 that is exposed in the gap g. This silicon carbide layer 15 will be described later. It should be noted also that the silicon carbide layer 15 is not patterned into segments corresponding to the pixel electrodes, contrary to the case of the conventional example of FIG. 1. In other words, the photoabsorption layer 16 extends over the gap g. Thereby the fabrication of the device is significantly simplified.

Further, an amorphous silicon carbide layer 17 doped to the p$^+$-type is provided to cover the entire surface of the amorphous silicon layer 16, and an upper, transparent electrode layer 18 of so-called ITO (indium tin oxide) is provided on the silicon carbide layer as an electrode opposing the pixel electrodes 13A, 13A', 13A" ... Any of the layers 16, 17 and 18 on the silicon carbide layer 15 is provided to cover the entire pixel electrodes without interruption, and the fabrication of the structure of FIG. 3 is significantly facilitated.

In the present embodiment, the thickness of the amorphous silicon layer 16 is set to be 1 $\mu$m and the thickness of the silicon carbide layer 15 is set to be 500 Å. The thickness of the silicon carbide layer 17 may be set to be 150 Å. As this silicon carbide layer 17 has a large conductivity, there appears substantially no gradient in the potential in the layer 17 and thus, the thickness of the layer 17 is not essential for the following description.

In order to reduce the concentration of electric field in the silicon carbide layer 15, the present invention employs lightly doped silicon carbide for the amorphous silicon carbide layer 15. More specifically, the amorphous silicon carbide layer 15 is doped to the n$^-$-type such that the conductivity thereof becomes substantially identical to that of the layer 16. By choosing the conductivity of the silicon carbide layer 15 as such, the concentration of the electric field in the layer 15 is prevented and a uniform electric field is obtained throughout the layer 15 and the layer 16. Thereby, the electric field in the amorphous silicon layer 16 is increased as will be described with reference to the band diagram of FIG. 6 and the problem of decay lag of images caused by the electrons and holes remaining in the silicon layer 16 after incidence of the optical beam is effectively eliminated.

Figure 4:
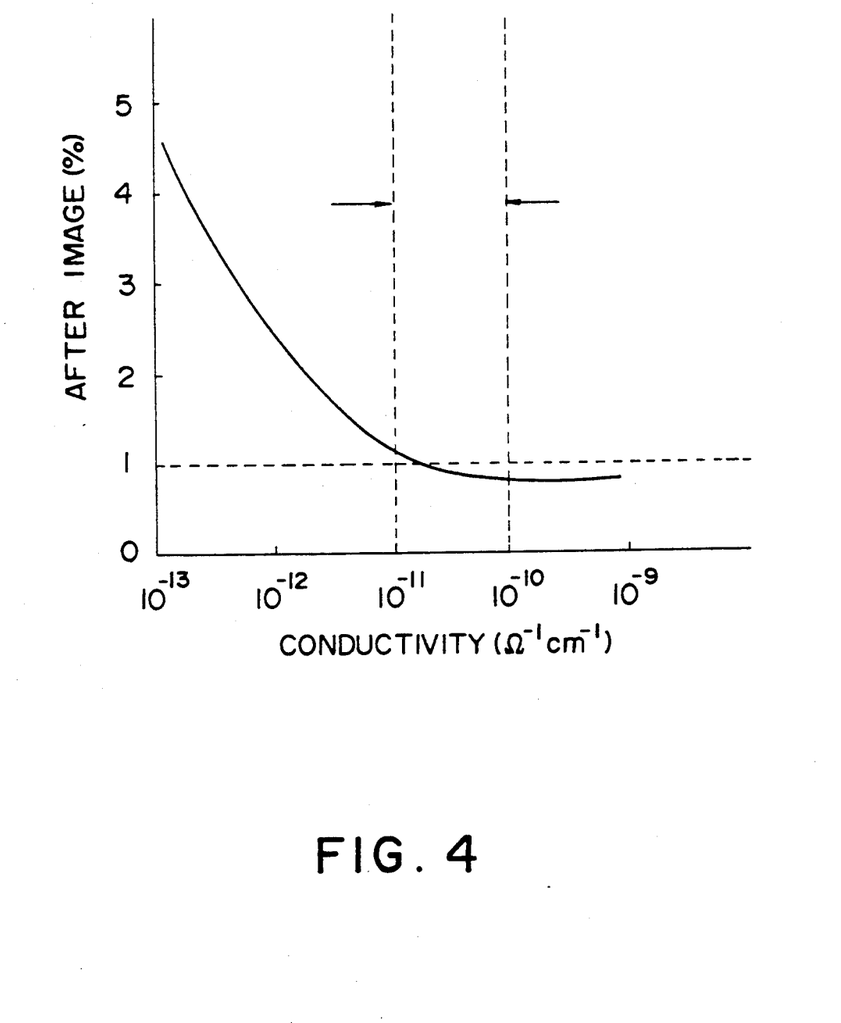
FIG. 4 is a graph showing the reduction of formation of the decay lag as a function of the conductivity of a silicon carbide layer used in a first embodiment of the present invention.

FIG. 4 shows the relationship, found by the applicant of the present invention, between the decay lag and the conductivity of the silicon carbide layer 15. The experiment was made on a photosensor having the amorphous silicon photoabsorption layer that has a conductivity of $10^{-10} \Omega^{-1} cm^{-1}$ by supplying an optical impulse. The decay lag was measured after a time corresponding to three fields (1/60 seconds for one field) of images has been elapsed. It should be noted that this conductivity of the silicon carbide layer 15 represents the value that is measured under the absence of the incident light. As will be seen clearly from the drawing, the decay lag decreases with increasing conductivity of the silicon carbide layer 15 and becomes to be about 1% or less when the conductivity is in the order of $10^{-11} \Omega^{-1} cm^{-1}$ or more.

As already noted, the electric field in the amorphous silicon layer 16 has to be equal to or larger than 4 volts/$\mu$m to eliminate the decay lag. In other words, the electric field $E_{Si}$ in the amorphous silicon layer 16 has to satisfy a relation:

$$E_{Si} = V_{Si}/d_{Si} \geq 4 \ (V/\mu m)$$

where $V_{Si}$ represents the voltage applied across the upper major surface and the lower major surface of the silicon layer 16, and $d_{Si}$ designates the thickness of the layer 16 represented in microns.

As $V_{Si}$ can be rewritten as:

$$V_{Si} = V_H \cdot \rho_{Si} \cdot d_{Si}/(\rho_{Si} \cdot d_{Si} + \rho_{SiC} \cdot d_{SiC})$$

where $V_H$ represents the total voltage applied across the electrode 13 and the electrode 18, $\rho_{Si}$ represents the resistivity of the amorphous silicon layer 16, $\rho_{SiC}$ represents the resistivity of the silicon carbide layer 15, and $d_{SiC}$ represents the thickness of the SiC layer 15, the former inequality is modified as:

$$\rho_{SiC} \leq \rho_{Si} \cdot (V_H/4 - d_{Si})/d_{SiC}$$

where $V_H$ is represented in volts and $d_{SiC}$ is represented in microns. In other words, the range of the conductivity of the silicon carbide layer 15 of $10^{-11} \Omega^{-1} cm^{-1}$ shown in FIG. 4 is defined more generally by the last mentioned, modified inequality. It should be noted that this range corresponds to the electric field of 4 volts/$\mu$m or more in the amorphous silicon layer 16.

Figure 5:
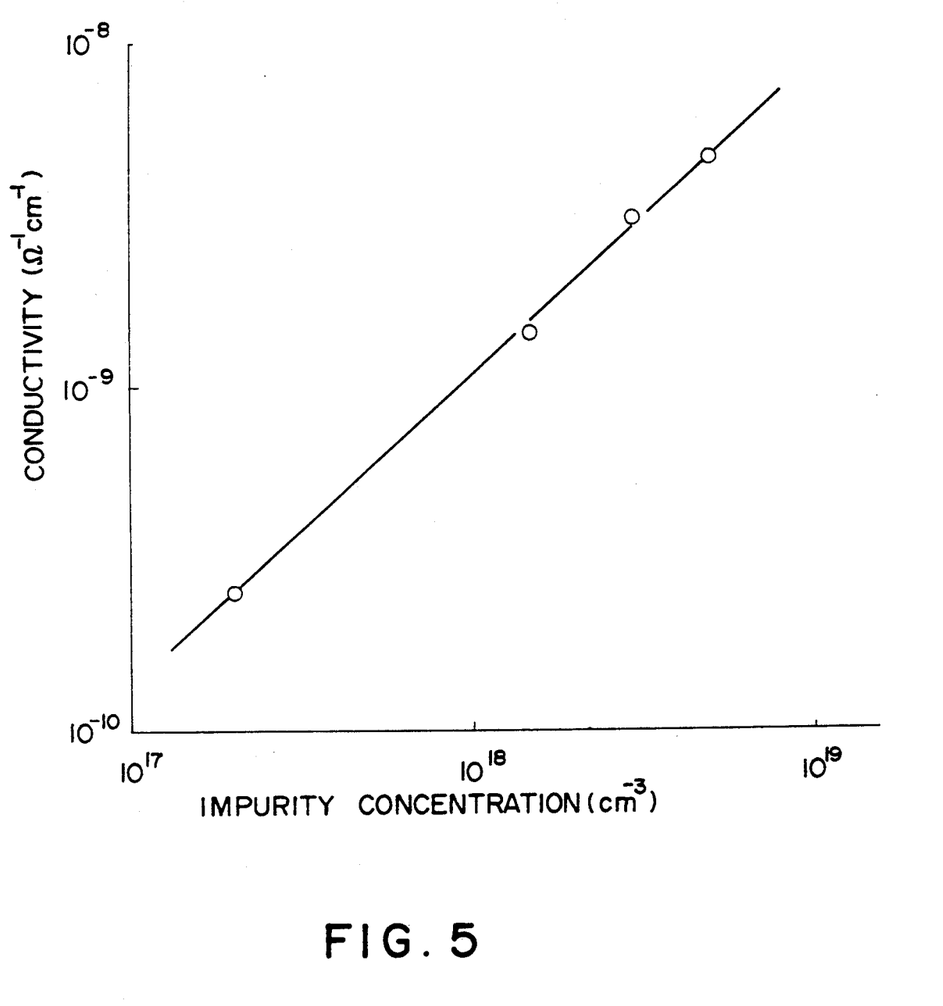
FIG. 5 is a graph showing a relationship between the conductivity and the level of doping used in the silicon carbide layer in the first embodiment of the present invention.

FIG. 5 shows a relationship between the conductivity of the silicon carbide layer 15 and the impurity concentration level therein. As is clearly seen in this drawing, there is a linear relationship between the conductivity and the impurity concentration level. From this drawing, it is clear that, to achieve the conductivity exceeding $10^{-11} \Omega^{-1} cm^{-1}$, one has to choose the level of impurity concentration of about $10^{16} cm^{-3}$ or more.

In the structure of FIG. 3, it will be noted that the excessive increase in the conductivity of the silicon carbide layer 15 causes a leak current between adjacent pixel electrodes such as between the electrode 13A and the electrode 13A' or between the electrode 13A and the electrode 13A". Thus, the conductivity of the silicon carbide layer 15 is chosen to be approximately equal to or smaller than the conductivity of the amorphous silicon layer 16. In other words, the conductivity of the doped silicon carbide layer 15 is set equal to or smaller than about $10^{-10} \Omega^{-1} cm^{-1}$. Preferably, the conductivity of the silicon carbide layer 15 is set at about $10^{-10} \Omega^{-1} cm^{-1}$. In this case, the amorphous silicon carbide layer 15 is doped to the impurity concentration level of about $10^{17} cm^{-3}$.

Figure 6:
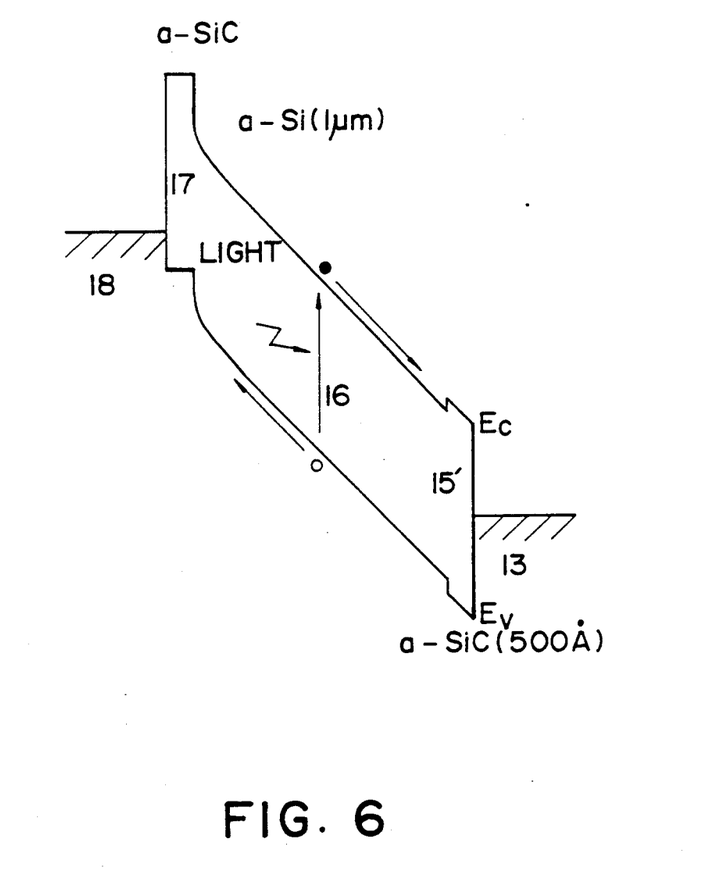
FIG. 6 is a diagram showing the band structure of the photosensor according to the first embodiment.

FIG. 6 shows the band structure that is obtained by the first embodiment of the present invention. As will be seen clearly, the steep slope of the band diagram in the silicon carbide layer 15 of FIG. 2 is reduced and a large electrical voltage is applied across the amorphous silicon layer 16. Thereby, the electric field of about 4 V/$\mu$m or more is induced in the layer 16 and the decay lag of the image is significantly reduced.

Figure 7:
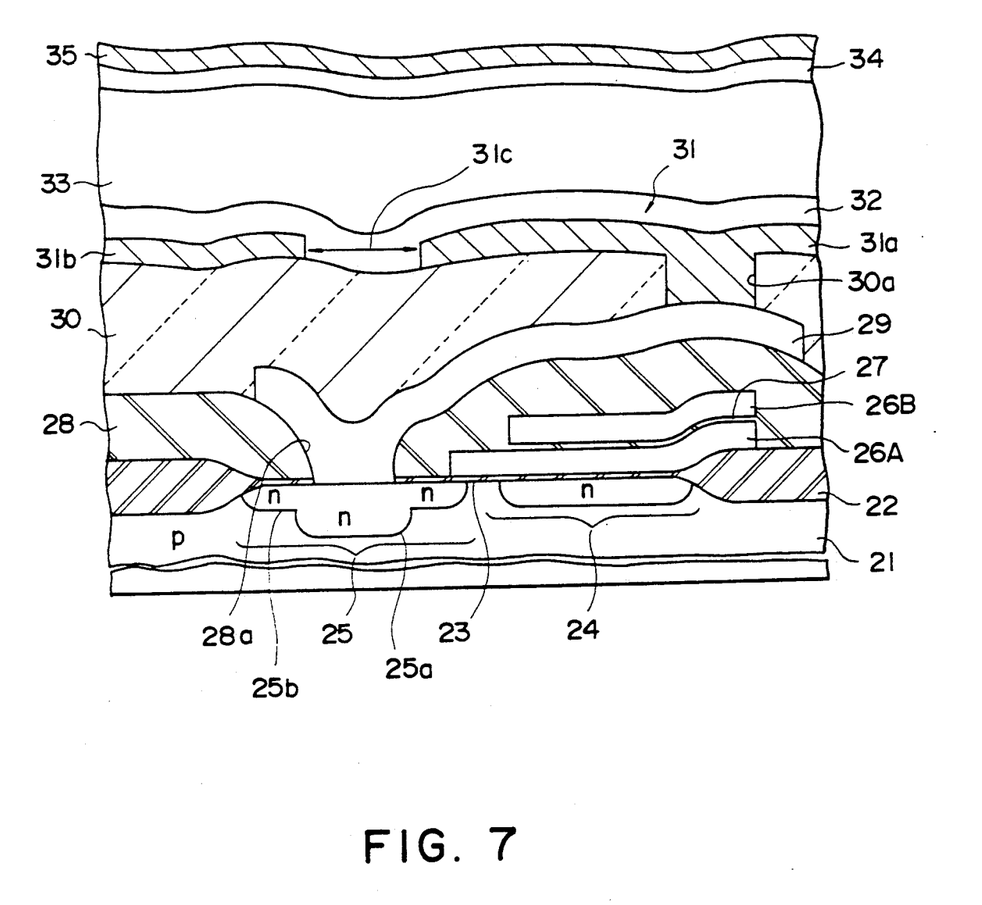
FIG. 7 is a cross-sectional view showing a second embodiment of the present invention.

FIG. 7 shows a second embodiment of the present invention.

Referring to FIG. 7, the photosensor comprises a p-type silicon substrate 21 on which a field oxide region 22 of silicon oxide is formed such that there is defined a device region that is covered by a gate insulator film 23. In the silicon substrate 21, there are formed an n-type region 24 forming a part of charge-coupled device and a doped region 25 forming a charge storage diode. Typically, the region 25 is formed from an n$^+$-type region 25a and an n-type region 25b surrounding the region 25a.

The substrate 21 is covered by an insulator layer 28 in which gate electrodes 26A and 26B for controlling the charge transfer are embedded in correspondence to the n-type region 24. Further, there is formed a contact hole 28a in the insulator layer 28 such that a part of the doped region 25 is exposed. On the insulator layer 28, there is provided an aluminum or aluminum alloy electrode 29 that makes an ohmic contact with the doped region 25 for transferring the electrons formed in response to incidence of optical beam to the doped region 25. Thereby, the electrons are accumulated in the capacitor formed at the p-n junction between the doped region 25 and the substrate 21. Commonly to the CCD devices, the electrons thus accumulated are transferred to the adjacent devices under the voltage applied to the gate electrodes 26A and 26B.

On the insulator layer 28, there is provided another insulator layer 30 such that the layer 30 buries the electrode 29 underneath. The insulator layer 30 may be a layer of PSG (phosphosilicate glass). When PSG is used, the layer 30 provides an excellent planarized top surface upon heat treatment.

Further, an electrode 31 formed of pixel electrodes 31a and 31b of aluminum alloy is provided on the insulator layer 30 such that the pixel electrode 31a is connected electrically to the aluminum electrode 29 via a contact hole 30a provided on the insulator layer 30. Similarly, the pixel electrode 31b is connected to a corresponding electrode not shown. The electrodes 31a and 31b are patterned such that they are separated from each other by a gap 31c. The structure described so far is obtained by a well established process and the process for forming these parts will be omitted.

On the pixel electrodes 31a and 31b, there is provided a layer of amorphous silicon carbide 32 such that the layer 32 fills the gap 31c between the pixel electrodes. It should be noted that the silicon carbide layer 32 is deposited by a plasma CVD process with a thickness of about 500 Å. In a typical example, the deposition is made at a temperature of 280° C. while flowing silane (SiH$_4$) and methane (CH$_4$) together with a hydrogen carrier gas. A dopant gas of phosphine (PH$_3$) is added to dope the layer 32 into the n$^-$-type. The doping of the layer 32 is made such that the silicon carbide layer 32 has a conductivity of $10^{-10}\Omega^{-1}$ cm$^{-1}$ that is substantially identical to the conductivity of an amorphous silicon layer to be provided thereon. Preferably, the silicon carbide layer is doped with a concentration level of about $10^{17}$ cm$^{-3}$.

On the silicon carbide layer 32, there is provided an amorphous silicon layer 33 by a plasma CVD process with a thickness of about 1 μm. The deposition may be made at about 280° C. by flowing silane. In order to provide a limited conductivity to the amorphous silicon layer 33, boron may be doped thereto in the form of diborane ($B_2H_6$) to the source gas at the time of deposition such that the amorphous silicon layer 33 has a conductivity of $10^{-9}-10^{-11}\Omega^{-1}$ cm$^{-1}$. It should be noted that the reaction between the amorphous silicon layer 33 and the underlying aluminum pixel electrodes 31a, 31b is positively prevented by the intervening silicon carbide layer 32.

Further, another amorphous silicon carbide layer 34 is deposited on the amorphous silicon layer 33 with a thickness of about 150 Å by a plasma CVD process at about 280° C. while flowing silane and methane together with diborane. Thereby, the obtained silicon carbide layer 34 is doped to the p-type. Further, a transparent electrode layer 35 of ITO is deposited on the silicon carbide layer 35 by depositing indium tin oxide ($In_2O_3.SnO_2$) by sputtering with a thickness of about 1500 Å.

In the present invention, the problem of decay lag of images is effectively eliminated without compromising the isolation between adjacent pixel electrodes and without complicating the fabrication process.

Further, the present invention is not limited to the embodiments described heretofore, but various variations and modifications may be made without departing from the scope of the invention.

What is claimed is:

1. A photosensor for detecting optical radiation, comprising:

an insulator layer having an upper major surface and a lower major surface;

a first electrode provided on the upper major surface of the insulator layer for collecting first type carriers that are formed upon incidence of optical radiation and having one of first and second polarities, said first electrode having an upper major surface and a lower major surface and segmented into a plurality of pixel electrodes each defined by a side wall, said plurality of pixel electrodes being separated from each other on the upper major surface of the insulator layer by a gap defined by a pair of opposing side walls of adjacent pixel electrodes;

a first silicon carbide layer having a lower major surface and an upper major surface and provided on the upper major surface of the insulator layer to bury the plurality of pixel electrodes underneath, said first silicon carbide layer further covering the gap separating adjacent pixel electrodes;

an optical absorption layer of amorphous silicon having a lower major surface and an upper major surface and provided on the silicon carbide layer continuously such that the amorphous silicon layer extends over the plurality of pixel electrodes and the gap between adjacent pixel electrodes, said optical absorption layer having a first conductivity and producing the first type carriers and second type carriers upon incidence of the optical radiation, said second type carriers having the other of the first and second polarities;

said first silicon carbide layer protecting the optical absorption layer from chemical reaction caused between the optical absorption layer and the first electrode;

a second silicon carbide layer having a lower major surface and an upper major surface and provided on the amorphous silicon layer for prohibiting passage of the first type carriers therethrough; and a second electrode of a transparent material having an upper major surface and a lower major surface and provided on the upper major surface of the silicon carbide layer for collecting the second type carriers produced in the optical absorption layer;

said first silicon carbide layer being doped to have a second conductivity that enables formation of an electric field equal to or larger than about 4 volts/um in magnitude in the amorphous silicon layer and such that said second conductivity of the first silicon carbide is equal to or smaller than said first conductivity of the amorphous silicon layer.

2. A photosensor as claimed in claim 1 in which said first and second silicon carbide layers comprise amorphous phase silicon carbide.

3. A photosensor as claimed in claim 1 in which said plurality of pixel electrodes forming the first electrode comprise a metal containing aluminum.

4. A photosensor as claimed in claim 1 in which said first silicon carbide layer is doped to have a conductivity of between $10^{-10}-10^{-11}\Omega^{-1}$ cm$^{-1}$ as said second conductivity.

5. A photosensor as claimed in claim 1 in which said first silicon carbide is doped have a conductivity substantially equal to said first conductivity of the optical absorption layer.

6. A photosensor as claimed in claim 1 in which said first silicon carbide layer is doped by an impurity element to the n-type with a concentration level of the impurity element of $10^{16}-10^{17}$ cm$^{-3}$.

7. A photosensor as claimed in claim 1 in which said first silicon carbide layer is doped to a concentration level of about $10^{17}$ cm$^{-3}$.

8. A photosensor as claimed in claim 1 further comprising a substrate defined by an upper major surface and a lower major surface and provided under the insulator layer, said substrate being formed with a charge coupled device in correspondence to each pixel electrode, each said charge coupled device having an electrode that is connected to the pixel electrode, for transferring the first type carriers.

* * * * *